(12) United States Patent
Fukuda

(10) Patent No.: US 6,989,558 B2
(45) Date of Patent: Jan. 24, 2006

(54) FIELD EFFECT TRANSISTOR

(75) Inventor: Koichi Fukuda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/339,455

(22) Filed: Jan. 10, 2003

(65) Prior Publication Data
US 2003/0230772 A1 Dec. 18, 2003

(30) Foreign Application Priority Data
Jun. 17, 2002 (JP) ............................. 2002-175348

(51) Int. Cl.
*H01L 29/76* (2006.01)
(52) U.S. Cl. ..................................... 257/213; 257/268
(58) Field of Classification Search ................ 257/288, 257/213, 268
See application file for complete search history.

(56) References Cited

U.S. PATENT DOCUMENTS
5,744,371 A * 4/1998 Kadosh et al. ............... 438/286
6,646,303 B2 * 11/2003 Satoh et al. ................. 257/321

OTHER PUBLICATIONS

MOS Scaling: Transistor Challenges for the 21st Century Scott Thompson, Portland Technology Developement, Intel Group Paul Packan, Technology Computer Aided Design, Intel Group Mark Bohr, Portland Technology Developement, Intel Group Intel Technology Journal Q3 1998, pp. 1-19.
International Technology Roadmap for Semiconductors Process Intergration, Devices, and Structures and Emerging Research Devices Author: Unknown 2001 pp. 1-47.

* cited by examiner

*Primary Examiner*—David S. Blum
(74) *Attorney, Agent, or Firm*—Volentine Francos & Whitt, PLLC

(57) ABSTRACT

In a field effect transistor having an active region defined by a device isolation region, and a gate electrode formed over the active region, in the lateral direction of the gate electrode, the source and drain formed in the active region is narrower than the active region at least at the parts proximate to each other to create a rounding region for allowing an additional current to flow through the rounding region. This increases the on-current, with almost no increase in the off-current. The operation speed is thereby increased, without increase in the power consumption during stand-by.

14 Claims, 15 Drawing Sheets

FIELD EFFECT TRANSISTOR

BACKGROUND OF THE INVENTION

1. Field of the Invention

The present invention relates to improvement of the characteristics of a field effect transistor (FET) of a metal-insulator-semiconductor transistor (MIS) structure.

2. Conventional Art

MOSFETs which are most widely used among the MISFETs formed in integrated circuits have an active region defined by a device isolation region, and a gate electrode formed over the active region. A source and a drain are formed in the active region, on respective sides of the gate electrode, and the part of the active region between the source and the drain constitute the channel.

A discussion on the performance of MOSFETs is given in the following publication No. 1:

Publication No. 1: MOS Scaling: Transistor Challenges for the 21st Century, Scott Thompson, et al. (Intel Technology Journal Q3'98).

Problems encountered in the development of MOSFETs are described in the following publication No. 2:

Publication No. 2: International Technology Roadmap for Semiconductors, 2001 Edition, "Process Integration, Devices, and Structures and Emerging Research Devices" (available from ITRS Web Site).

The power consumption during stand-by of a MISFET depends on the off-current value (Ioff), while the operating speed of the circuit depends on the on-current value (Ion). It is therefore desirable that the off-current value (Ioff) be smaller, and the on-current value be larger. The ratio of the on-current value to the off-current value (Ion/Ioff ratio) can be improved to a certain degree, up to a certain limit, by optimizing the channel profile and drain profile, in a specific technology node corresponding to specific minimum values of the gate length and the gate oxide thickness. In order to improve the performance further, it is necessary to advance to a next technology node, to reduce the gate length and the gate oxide thickness. However, the size reduction is associated with increase in gate leak current, and degradation in the gate oxide reliability. It will therefore be necessary to lower the power supply voltage. As a result, in a small-sized transistors, it is considered that, with advancement of the technology node, the same Ion/Ioff ratio can be realized at best, with a lower voltage. See for example Publication No. 2, in particular FIG. 36a, in which "Nominal LOP NMOS sub-threshold leakage current" corresponds to Ioff, while "Nominal LOP NMOS Saturation drive current" corresponds to Ion. It is seen that the former tends to increase from 100 pA/$\mu$m, while the latter is kept constant at about 600 $\mu$A/$\mu$m, indicating that the performance is not improved with the technology advancement and the chip size reduction.

SUMMARY OF THE INVENTION

The present invention has been made to solve the problem described above, and its object is to provide a field effect transistor with which it is possible to improve the relationship between the on-current value and the off-current value, and to improve the operation speed without increasing the consumption current during stand-by time.

The invention provides a field effect transistor having an active region defined by a device isolation region, and a gate electrode positioned over the active region, wherein the widths of at least parts of the source and drain proximate to each other in the lateral direction of the gate electrode are smaller than the width of corresponding parts of the active region.

The invention also provides a field effect transistor having an active region defined by a device isolation region and a gate electrode disposed over the active region, wherein at least parts of the source and drain formed in the active region, proximate to each other are separated from the device isolation region in the lateral direction of the gate electrode.

BRIEF DESCRIPTION OF THE DRAWINGS

In the accompanying drawings:

FIG. 4 is a schematic plan view showing the operation of an N-channel MOSFET according to Embodiment 2 of the present invention with its gate being on;

FIG. 6 is a schematic plan view showing the operation of an N-channel MOSFET according to Embodiment 3 of the present invention with its gate being on;

FIG. 8 is a schematic plan view showing the operation of an N-channel MOSFET according to Embodiment 4 of the present invention with its gate being on;

FIG. 10 is a schematic plan view showing the operation of an N-channel MOSFET according to Embodiment 5 of the present invention with its gate being on;

FIG. 12 is a schematic plan view showing the operation of an N-channel MOSFET according to Embodiment 6 of the present invention with its gate being on;

FIG. 14 is a schematic plan view showing the operation of an N-channel MOSFET according to Embodiment 7 of the present invention with its gate being on.

DETAILED DESCRIPTION OF THE PREFERRED EMBODIMENTS

Embodiments of the invention will now be described with reference to the drawings.

Embodiment 1.

Figure 1:
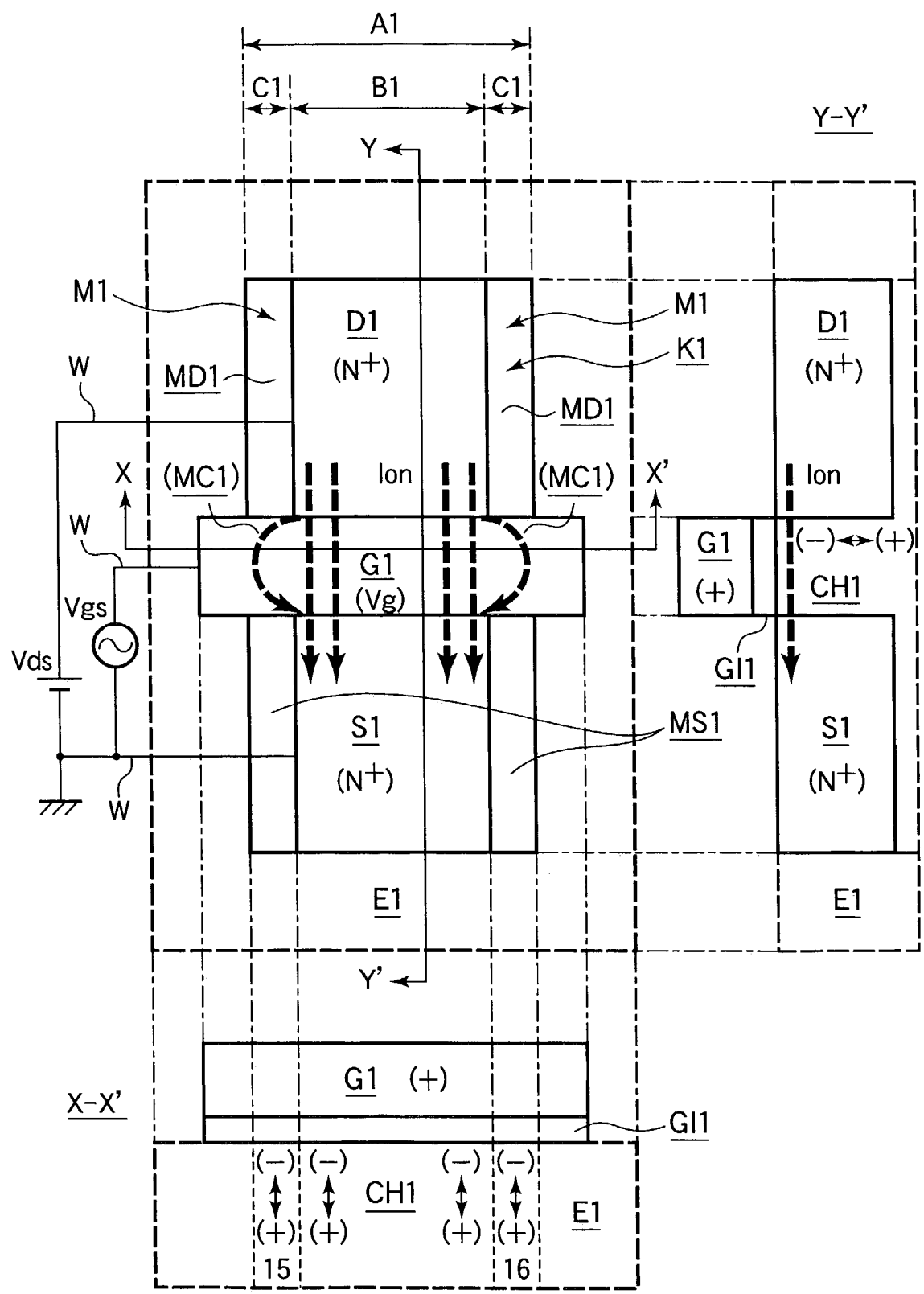
FIG. 1 is a schematic plan view showing the operation of an N-channel MOSFET according to Embodiment 1 of the invention with its gate being on, a cross section view along line X–X', and a cross sectional view along line Y–Y'.
Figure 2:
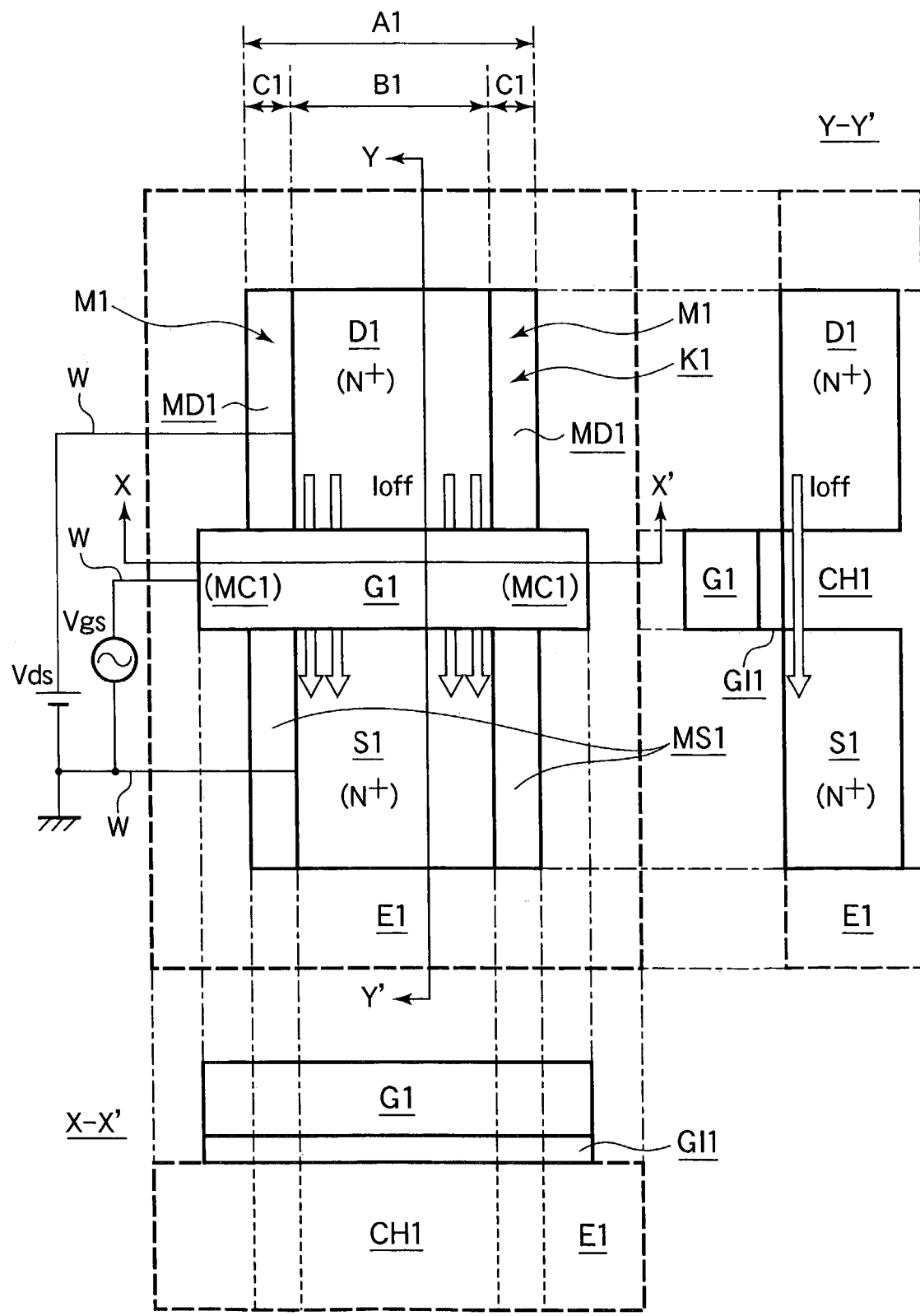
FIG. 2 is a schematic plan view showing the operation of the MOSFET of FIG. 1 with its gate being off, a cross section view along line X–X', and a cross sectional view along line Y–Y'.
Figure 3:
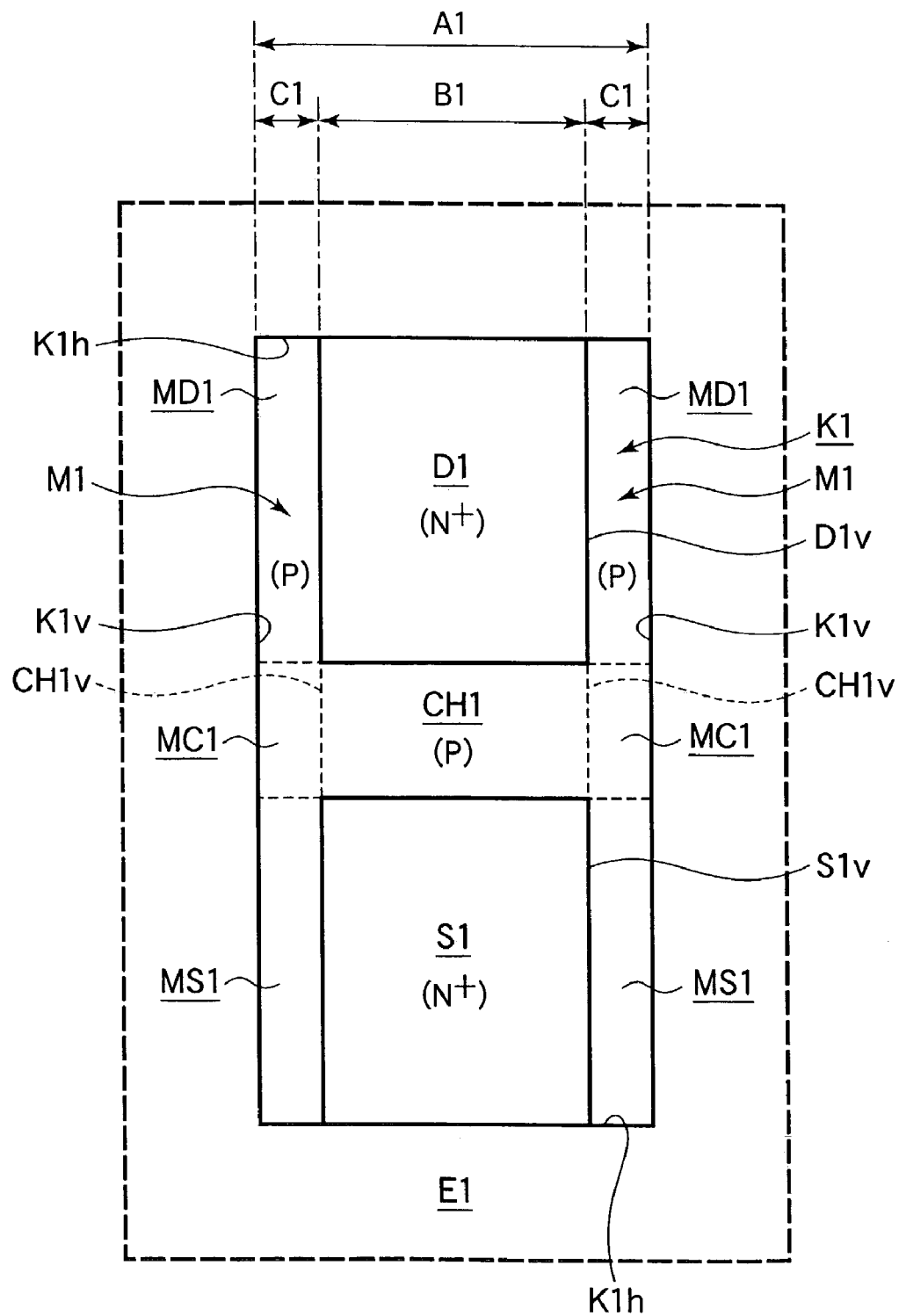
FIG. 3 is a plan view with the gate electrode and the gate insulating film removed from FIG. 1.

FIG. 1 to FIG. 3 shows an N-channel MOSFET (hereinafter referred to as "NMOS") of Embodiment 1 of the invention. FIG. 1 is a schematic plan view showing the operation of the NMOS with the gate being on, and X–X' and Y–Y' cross sectional view. FIG. 2 is a schematic plan view of the NMOS of FIG. 1 with the gate being off, and X–X' and Y–Y' cross sectional view. FIG. 3 is a plan view with the gate electrode and the gate insulation film removed from FIG. 1 or FIG. 2.

The illustrated NMOS forms part of an integrated circuit formed in a silicon (Si) substrate, and is isolated from other devices by a device isolation region El formed for example of a silicon oxide ($SiO_2$). An active region is formed, being defined by the device isolation region E1, with the active region being surrounded by the device isolation region E1. In the illustrated example, the active region K1 is rectangular, and has a pair of edges K1$h$ extending in the lateral direction in the drawing, and a pair of edges K1$v$ extending the vertical direction in the drawing. These edges are also the edges of the device isolation region E1.

A gate electrode G1 is provide to cover a belt-shaped part extending in the lateral direction, in the central part of the active region K1. The gate electrode G1 is formed for example of polysilicon, and a gate insulating film GI1 is disposed between the gate electrode G1 and the active region K1. The gate electrode G1 is connected to a wiring pattern outside of the active region K1. Although the gate electrode G1 is often formed integrally with the wiring pattern, the drawing shows the shape of the gate electrode only, and the wiring pattern and other circuit parts connected by the wiring pattern to the gate electrode is shown schematically as a power source Vds, a signal source Vgs and lead lines W.

A drain D1 is formed in a part, an upper part in the drawing, of the active region K1. The drain D1 occupies most of the part of the active region K1 on one side, the upper side in the drawing, of the gate electrode G1. Formed on the other side, the lower side in the drawing, of the active region K1 is a source S1. The source S1 occupies most of the part of the active region K1 on the other side, the lower side in the drawing, of the gate electrode G1. In the illustrated example, the drain D1 and the source S1 are both rectangular, and the width B1 of the drain D1 and the source S1 is narrower than the width A1 of the active region K1, and one of the edges of each of the drain D1 and the source S1 that extend laterally coincides with one of the edges of the gate electrode G1, and the other edge parallel thereto coincides with the corresponding one of the laterally-extending edges, K1$h$, of the device isolation region E1. The vertically-extending edges D1$v$, S1$v$ are separated from the vertically-extending edges K1$v$ of the device isolation region E1, by a distance C1 (distance in the lateral direction of the gate electrode G1).

The drain D1 and the source S1 are doped so that they of $N^+$ type. The remaining parts of the active region K1 (parts other than the drain D1 and the source S1) are doped so that they are of P type. For instance, the same impurity is implanted throughout the remaining parts.

The part of the P type region positioned between the drain D1 and the source S1 and covered by the gate electrode G1 forms a channel CH1. The channel CH1 has its edges CH1$v$ separated from the vertically-extending edge K1$v$ of the device isolation region E1. The parts between the side edges D1$v$, S1$v$ and CH1$v$ of the drain D1, the source S1, and the channel CH1, and the vertically-extending edges K1$v$ of the device isolation region are called "drain-side rounding region MD1," "source-side rounding region MS1," and "rounding channel region MC1," for the reason that will be apparent later, and the entirety of these parts are also called "rounding region" M1.

It has been discovered that the NMOS having the above configuration has a better Ion/Ioff ratio. The reason therefor will now be described.

The on-current Ion and the off-current Ioff of the above-described NMOS are defined as follows. That is, the current which flows through the drain D1 and the source S1 when, as shown in FIG. 1, a voltage Vgs=Vg which is not smaller than a threshold voltage (Vt) is applied across the gate electrode G1 and the source S1, and a voltage Vds which is sufficient to cause the NMOS in a saturated condition is applied across the drain D1 and the source S1, is the on-current Ion. On the other hand, the current which flows through the drain D1 and the source S1 when, as shown in FIG. 2, the voltage Vds applied across the drain and the source is the same as above, and the voltage Vgs=Vg applied across the gate electrode G1 and the source S1 is zero (Vgs=0), is the off-current Ioff.

As shown in FIG. 1, when the drain voltage Vds and the gate voltage Vgs=Vg are both applied, a current flows from the drain D1 to the source S1. The current flows not only through the channel CH1, but also through the part MC1 of the rounding regions M1 adjacent to the channel CH1, due to expansion (of the area in which the current flows) in the lateral direction of the channel CH1, and the sum of these current components form the on-current Ion. That is, compared with a similar on-current (Ionr) for a case in which no rounding region M1 is provided, the on-current is increased by the amount (ΔIon) which flows through the rounding-region. Therefore, it can be expressed that Ion=Ionr+ΔIon.

As shown in FIG. 2, when the drain voltage Vds is applied and the gate voltage Vgs is zero, the current which flows from the drain D1 to the source S1 consists almost only of the current which flows through the channel CH1, and the current which flows through the rounding regions M1 is very small and is negligible. Accordingly, the off-current is about the same as the off-current (Ioffr) for a case where the rounding region is not provided. Therefore, it can be expressed that Ioff=Ioffr.

As a result, the ratio of the on-current to the off-current (Ion/Ioff) for the present invention is (Ionr+ΔIon)/Ioffr, and is larger than the ratio (Ionr/Ioffr) for the conventional case. If the device dimensions (e.g., the gate electrode width) are adjusted so that the on-current of the present invention is the same as that of the conventional configuration, the off-current of the present invention will be smaller than that of the conventional configuration, and the on-current to off-current ratio also becomes larger.

The reason why the on-current can be increased while there is almost no increase in the off-current, by providing the rounding region as described above, is explained below. The path followed by the current flowing in the rounding region (hereinafter referred to as "rounding current") is along a curve and is longer than the path followed by the current flowing through the channel CH1. That is, the effective channel length for the rounding current is longer than the channel CH1 between the drain D1 and the source S1.

The relationship between the current flowing through the channel and the channel length is discussed in the above Publication No. 1. That is, the on-current Ion (vertical axis "$I_D$" in FIG. 25, or "$I_{DSAT}$" in the description) decreases, substantially in reverse proportion to the channel length ("$L_{EP}$" in FIG. 25), as shown in FIG. 25 in Publication No. 1, while the off-current Ioff (vertical axis in FIG. 24 or "$I_{OFF}$" in the description) decreases substantially exponentially with respect to the channel length ("$L_{EP}$" in FIG. 24), as shown in FIG. 24 in Publication No. 1. That is, it decreases along a curve given by $a*b^{-L}$, where "L" denotes the channel length, and "a" and "b" denote constants. In FIG. 24, only the vertical axis represents a logarithm, so that a variation along a straight line in FIG. 24 is an exponential variation.

Accordingly, the rounding current for which the effective channel length is long contributes to the increase in the Ion, but its contribution to the Ioff is very small and is negligible. This is schematically illustrated in FIG. 1 and FIG. 2. That is, as shown in FIG. 1, a significant rounding current is included in the on-current, while no appreciable rounding current is included in the off-current as shown in FIG. 2.

As has been described, the present embodiment increase the on-current to off-current ratio by providing the rounding regions on both sides of the channel. As a result, the operation speed can be increased without increasing the power consumption in the stand-by state.

Embodiment 2.

Figure 4:
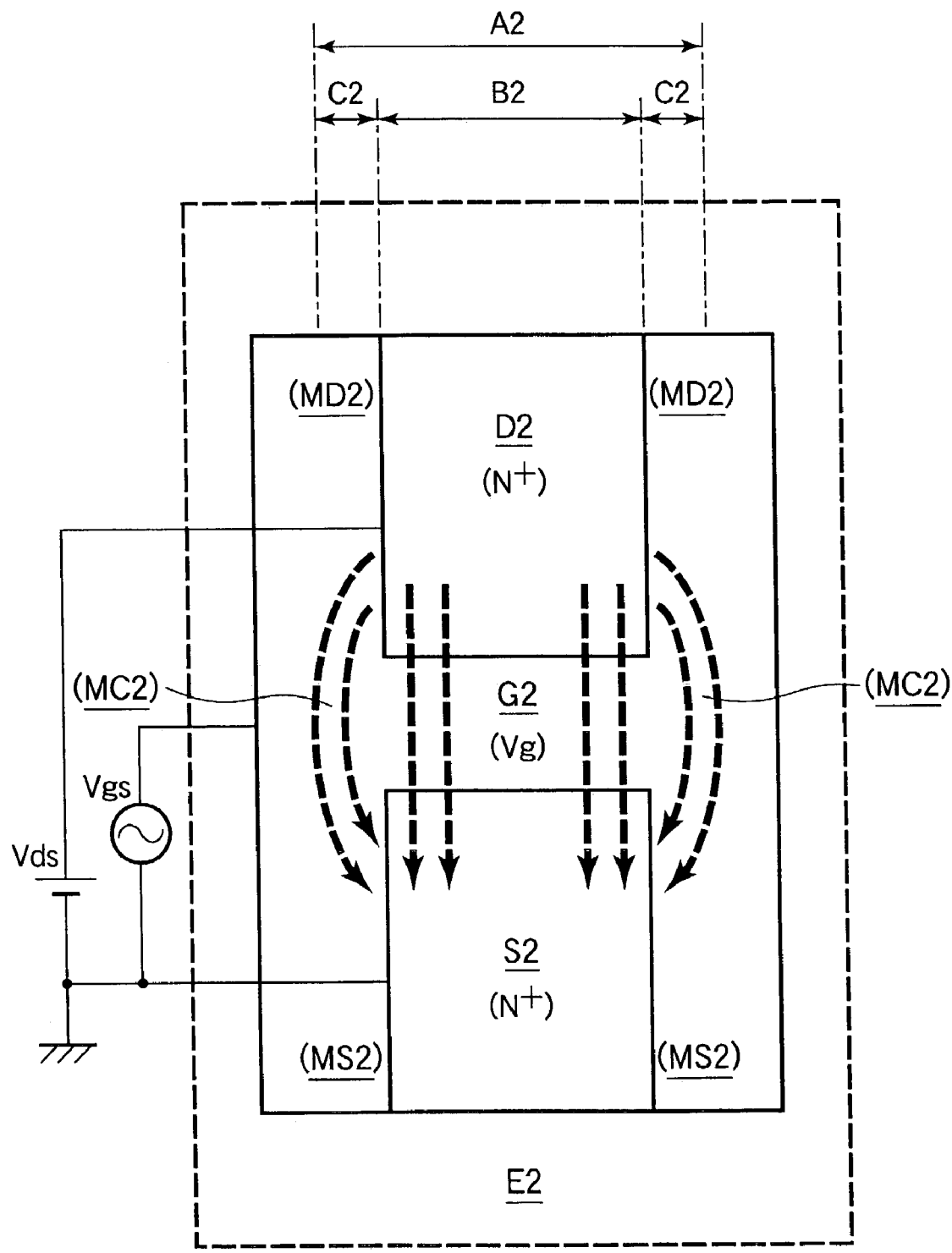
Figure 5:
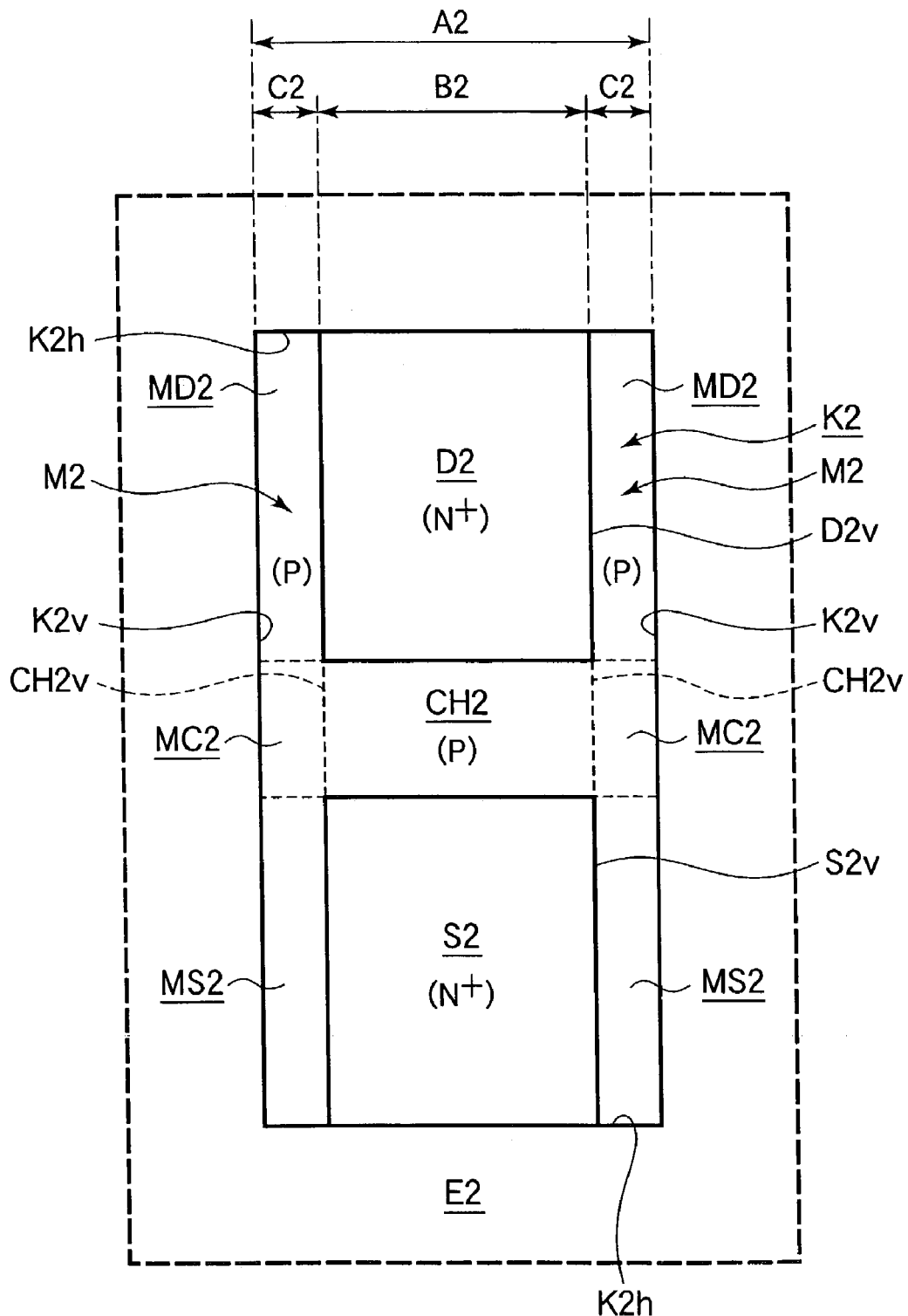
FIG. 5 is a plan view with the gate electrode and the gate insulating film removed from FIG. 4.

FIG. 4 is a schematic plan view showing the operation of the NMOS according to Embodiment 2 of the present invention wits the gate being on. FIG. 5 is a plan view with the gate electrode and the gate insulation film removed from FIG. 4. Members and parts similar to those in Embodiment 1 are designated by similar reference marks, but with the suffix "2" instead of "1."

This embodiment is similar to Embodiment 1, but the shape of the gate electrode (as well as the gate insulating film) is different. That is, the gate electrode G2 of this embodiment is formed to cover the entire rounding regions M2 as well as the channel CH2.

With this configuration, the voltage is applied over the entire rounding regions M2 when the gate is on, so that there will be additional rounding current components which flow out of the side edges of the drain D2 and enter the side edges of the source S2, and these additional current components further increase the on-current value, compared with Embodiment 1, and the on-current to off-current ratio is further improved.

Embodiment 3.

Figure 6:
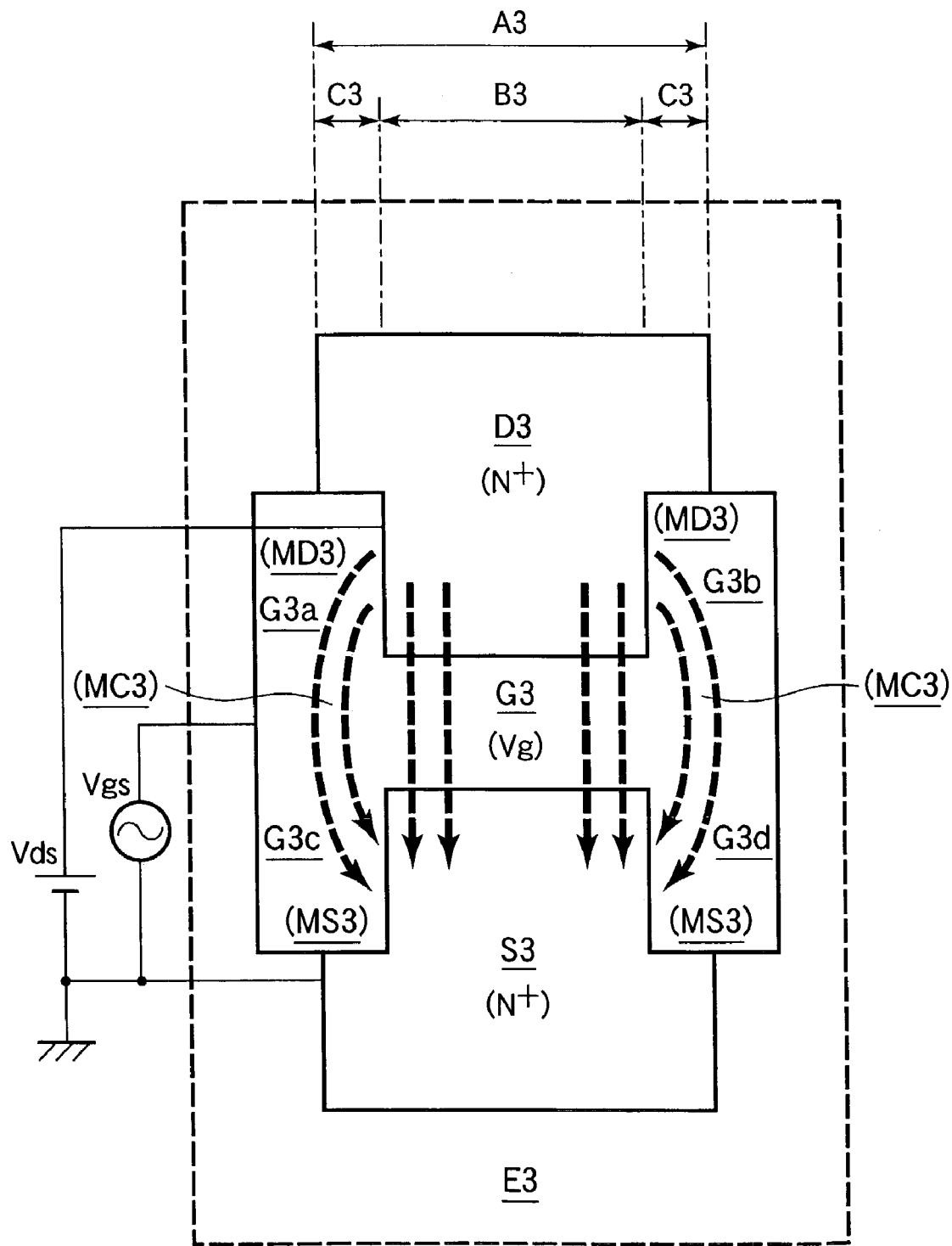
Figure 7:
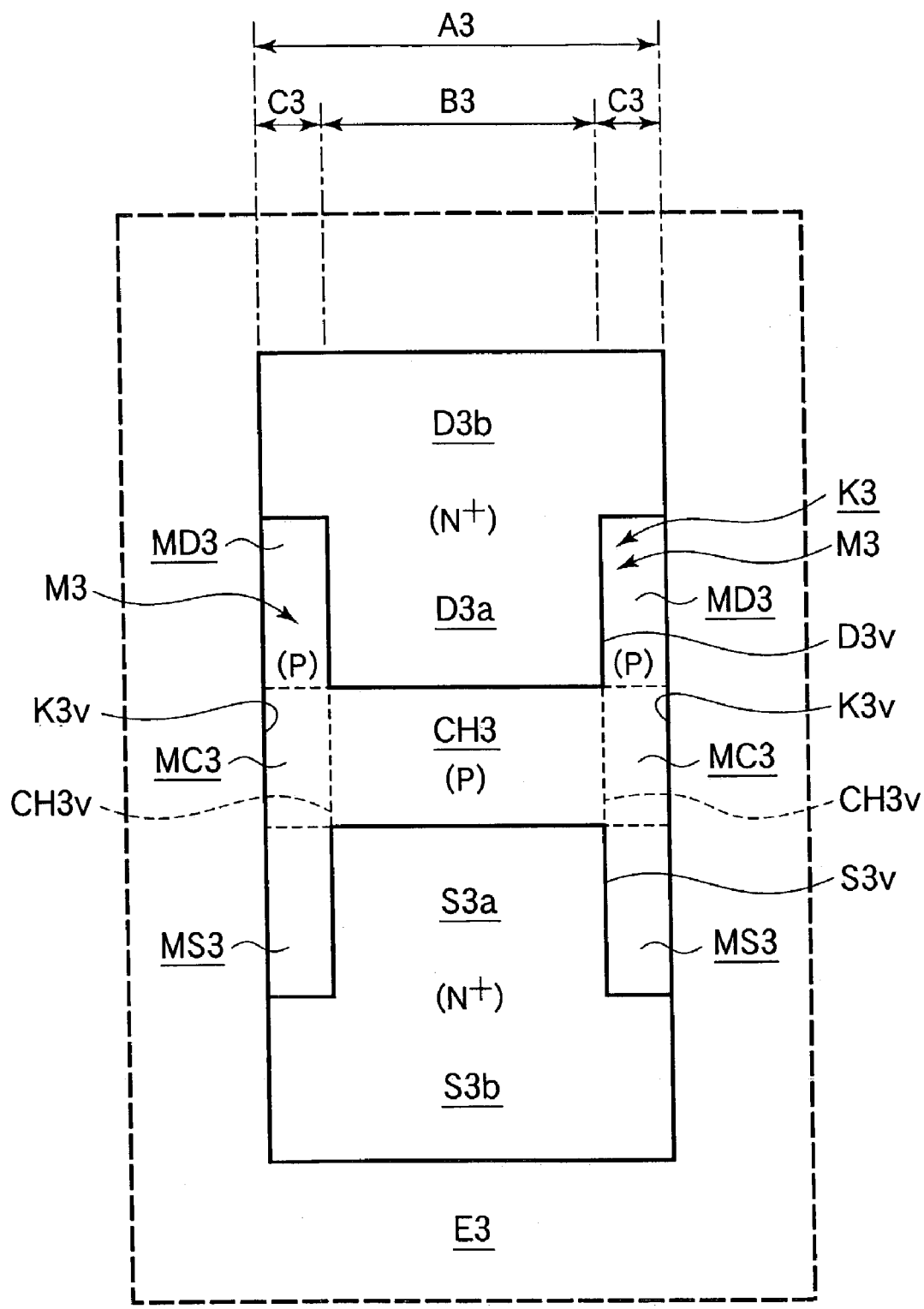
FIG. 7 is a plan view with the gate electrode and the gate insulating film removed from FIG. 6.

FIG. 6 is a schematic plan view showing the operation of the NMOS according to Embodiment 3 of the present invention with the gate being on. FIG. 7 is a plan view with the gate electrode and the gate insulation film removed from FIG. 6. Members and parts similar to those in Embodiment 2 are designated by similar reference marks, but with the suffix "3" instead of "2."

This embodiment is similar to Embodiment 2, but the shapes of the drain, source, rounding regions, and gate electrode are different. That is, the drain D3 and the source S3 of this embodiment have widths narrower, and are separated from the device isolation region E3 in the lateral direction of the gate electrode G3, only at the parts D3*a* and S3*a* proximate to each other. At parts D3*b* and S3*b* far from each other, the drain D3 and the source S3 are of the same width as the width A3 of the active region K3, and are in contact with the device isolation region E3. Rounding regions M3 are formed between the parts D3*a* and S3*a* of the drain D3 and source S3 proximate to each other, and the device isolation region E3, and between the channel CH3 and the device isolation region E3. In other words, the rounding regions M3 are formed to occupy only parts MC3 on extensions, in the lateral direction of the gate electrode G3, of the channel CH3 positioned between the source S3 and the drain D3, and parts MD3 and MS3 adjacent to the parts MC3 in the longitudinal direction of the gate electrode G3. The gate electrode G3 is formed to cover not only the channel CH3 but also the entire rounding regions M3.

With the configuration described above, if the width B3 of the parts D3*a* and S3*a* proximate to each other are identical to the width B2 of the drain D2 and source S2 of Embodiment 2, the on-current will be about the same as Embodiment 2. This is because the current components which flow out and enter the parts of the drain D2 and source S2 which are far away from each other are very small and are negligible.

On the other hand, Embodiment 3 has an advantage in that parts D3*b* and S3*b* of the drain D3 and the source S3 far away from each other have a greater width compared with Embodiment 1 and Embodiment 2, and the size of the gate electrode G3 is smaller than in Embodiment 2, so that the areas which can be used for contact with the drain D3 and source S3 is larger, and formation of contacts is easier.

Embodiment 4.

Figure 8:
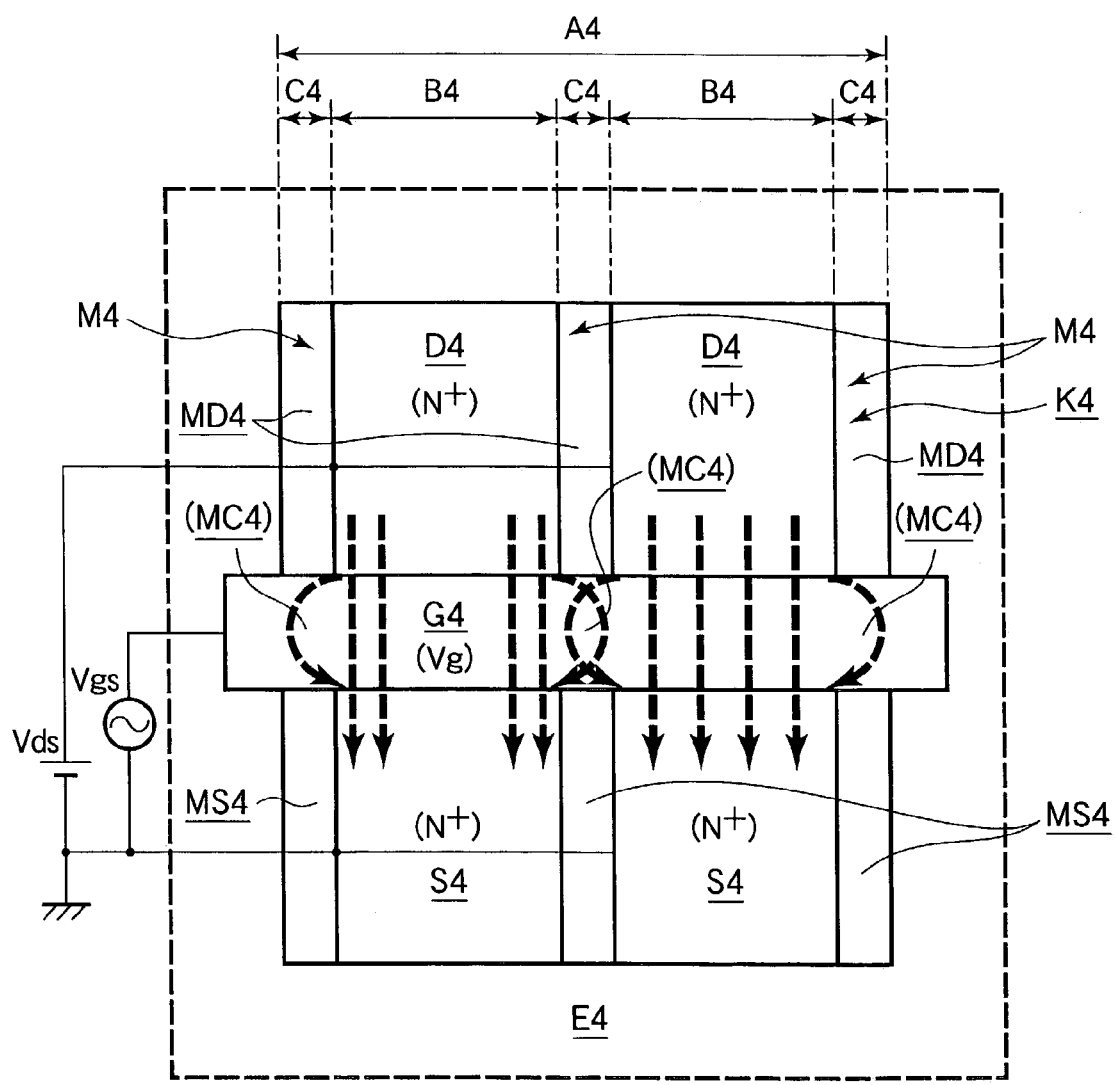
Figure 9:
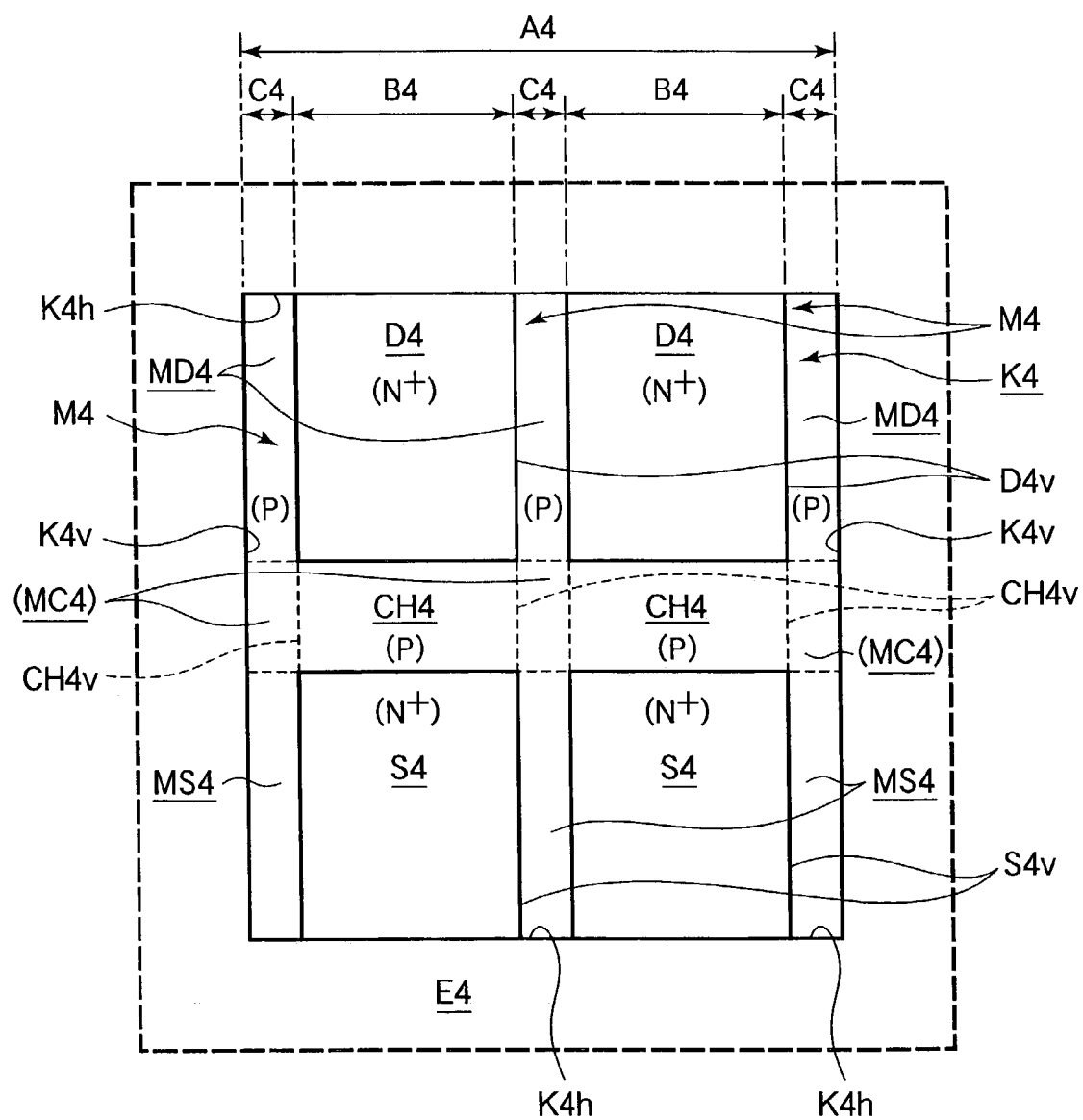
FIG. 9 is a plan view with the gate electrode and the gate insulating film removed from FIG. 8.

FIG. 8 is a schematic plan view showing the operation of the NMOS according to Embodiment 4 of the present invention with the gate being on. FIG. 9 is a plan view with the gate electrode and the gate insulation film removed from FIG. 8. Members and parts similar to those in Embodiment 1 are designated by similar reference marks, but with the suffix "4" instead of "1."

This embodiment is similar to Embodiment 1, but the drain and the source are divided, e.g., divided into two parts or divisions, in the lateral direction of the gate electrode. The sum of the widths B4 of the divisions D4 is smaller than the width A4 of the active region K4. Because of the division of the drain D4 and the source S4, the channel CH4, which is positioned between the drain and the source, is also divided. Rounding regions M4 are formed also between the divisions of the drain D4, between the divisions of the source S4, and between the divisions of the channel CH4, as well as between the edges of the (outermost) divisions of the source, drain and channel and the edges of the device isolation region E4. The rounding region M4 formed between the divisions of the drain D4, between the divisions of the source S4, and between the divisions of the channel CH4 is also called "intervening rounding region." In contrast the rounding regions formed between the outermost divisions of the drain D4 and the source S4 is called "outer rounding regions."

With the configuration described above, there are additional rounding current components because of the intervening rounding region, with the result that the on-current to off-current ratio is further improved. In particular, when the sum of the widths of the divisions of the drain D4, or the divisions of the source S4 is the same as the width of the drain D1 or of the source S1 in Embodiment 1, and if the sum of the widths of the three rounding regions M4 is the same as the sum of the widths of the two rounding regions M1 in Embodiment 1, Embodiment 3 has a better on-current to off-current ratio. This is because the density of the rounding current is higher at locations near the edges of the divisions of the source or drain than at locations far from the edges.

In the example illustrated, the drain and the source are divided into two parts, but they may be divided into more than two parts. In this case, more than two intervening rounding regions are formed, and the additional current components are further increased.

Embodiment 5.

Figure 10:
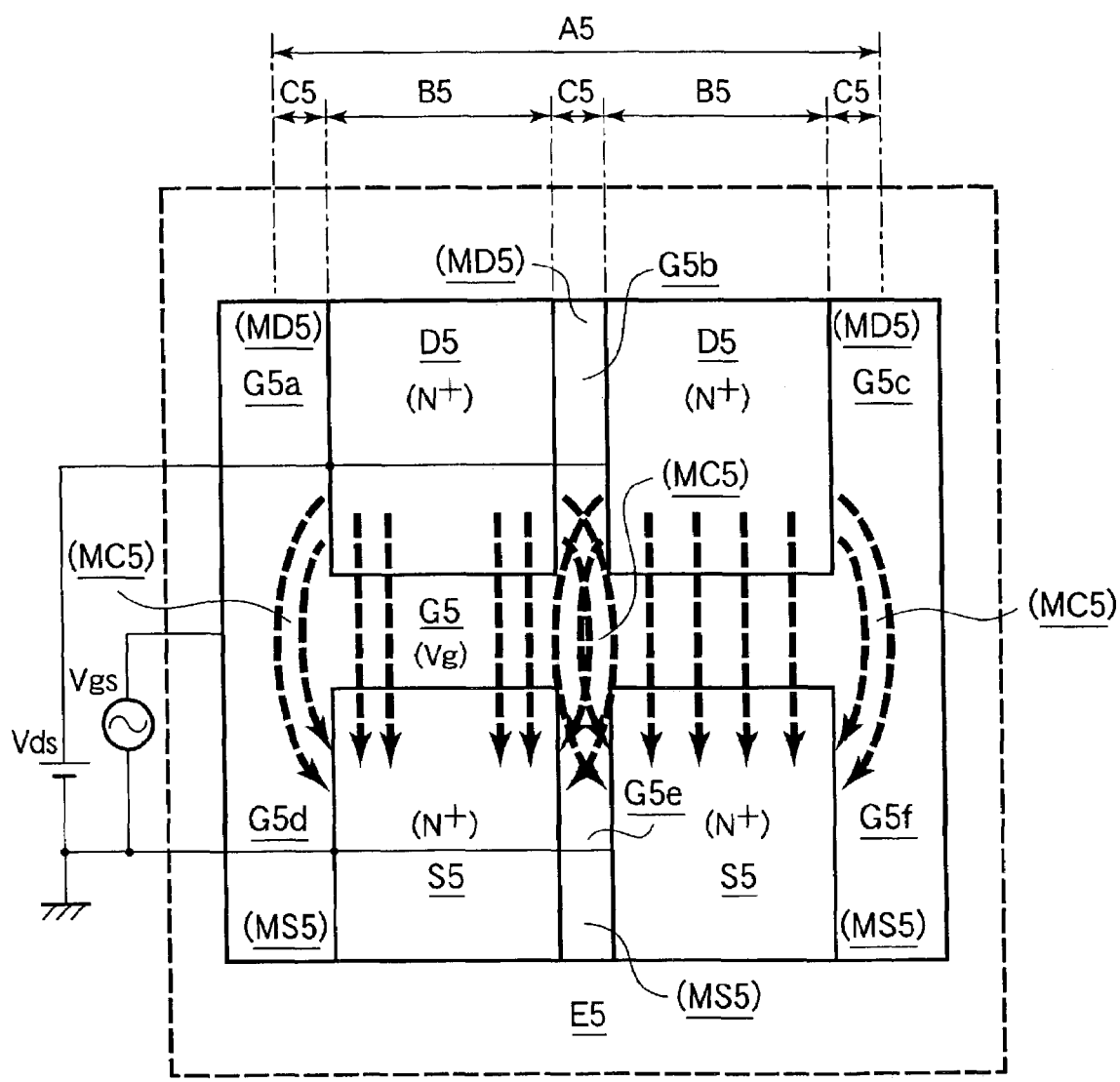
Figure 11:
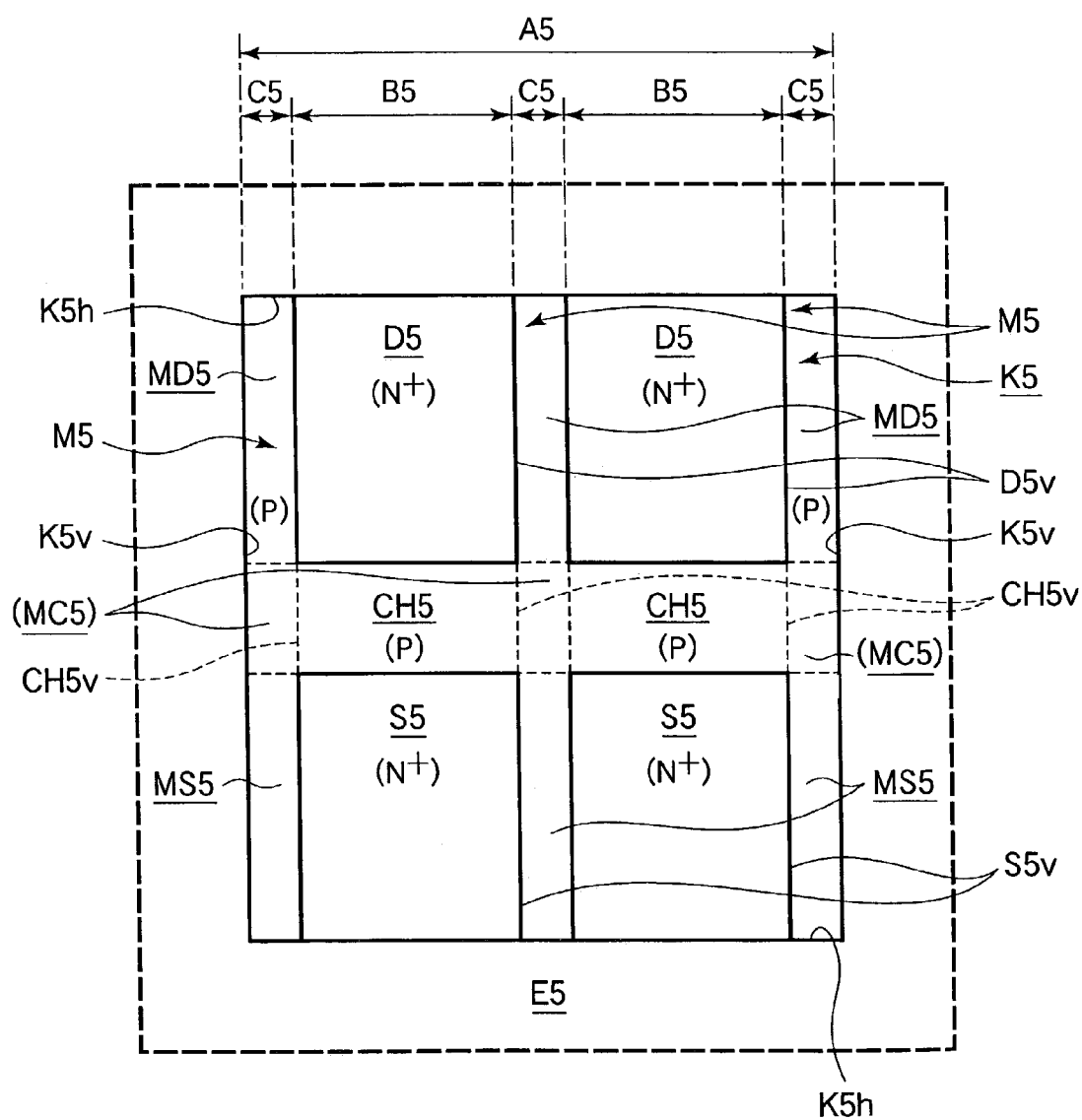
FIG. 11 is a plan view with the gate electrode and the gate insulating film removed from FIG. 10.

FIG. 10 is a schematic plan view showing the operation of the NMOS according to Embodiment 5 of the present invention with the gate being on. FIG. 11 is a plan view with the gate electrode and the gate insulation film removed from FIG. 10. Members and parts similar to those in Embodiment 4 are designated by similar reference marks, but with the suffix "5" instead of "4."

Embodiment 5 is similar to Embodiment 4, and its difference from Embodiment 4 is the same as the difference of Embodiment 2 from Embodiment 1. That is, the gate electrode G5 is formed to cover not only the channel CH5, but also the entire rounding regions M5.

With this configuration, the voltage is applied over the entire rounding regions M5 when the gate is on, so that there will be additional rounding current components which flow out of the side edges of the divisions of the drain D5 and enter the side edges of the divisions of the source S5, and these additional current components further increase the on-current value, compared with Embodiment 4, and the on-current to off-current ratio is further improved.

Embodiment 6.

Figure 12:
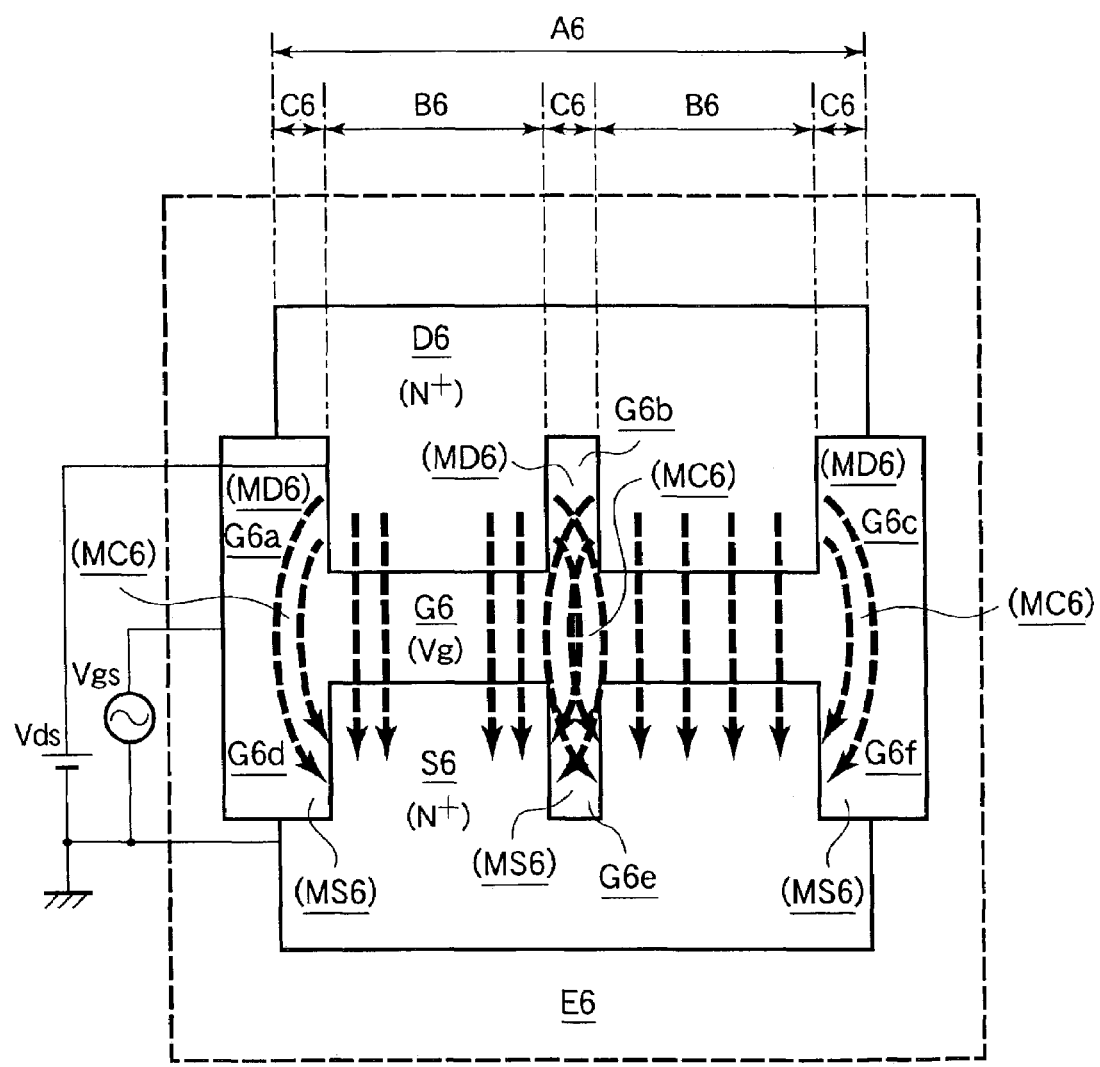
Figure 13:
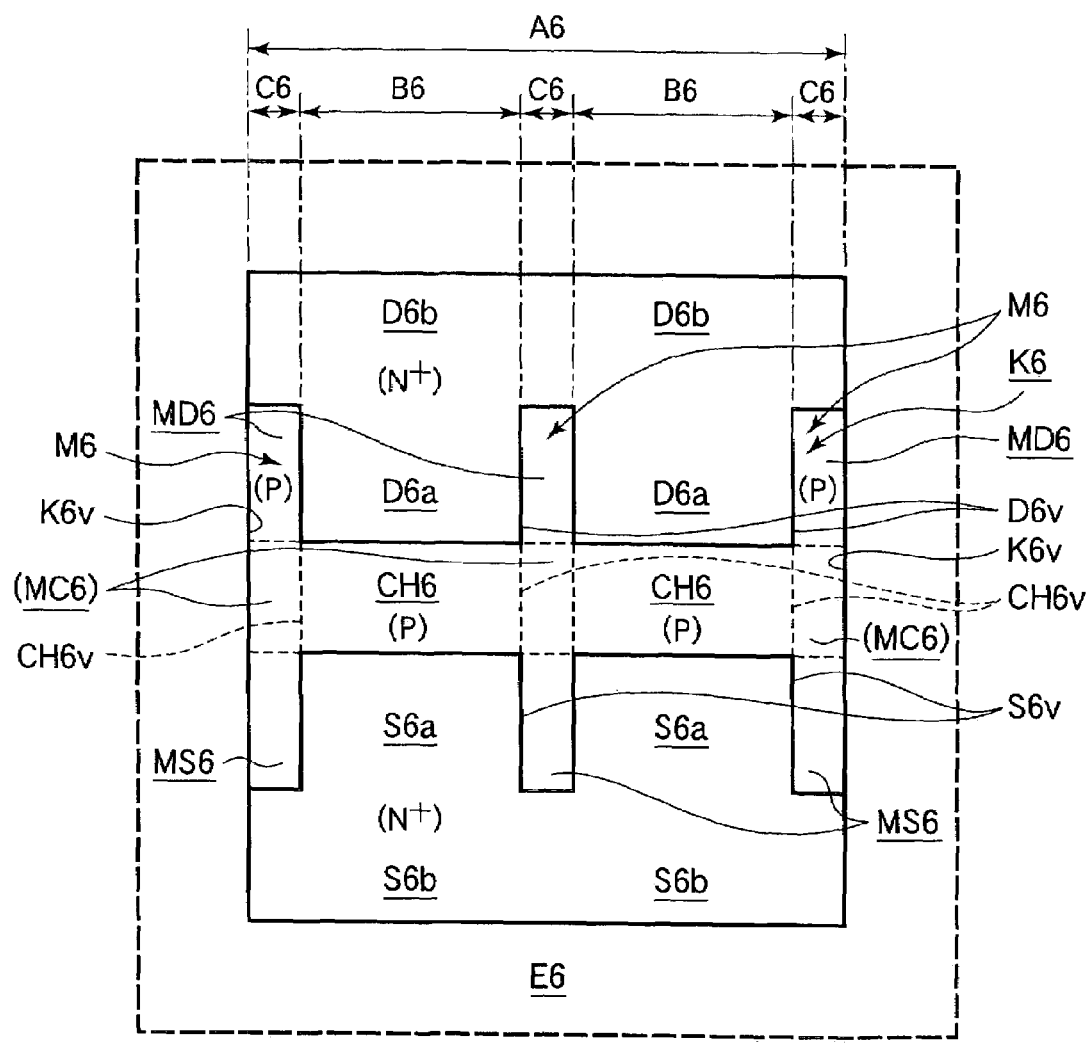
FIG. 13 is a plan view with the gate electrode and the gate insulating film removed from FIG. 12.

FIG. 12 is a schematic plan view showing the operation of the NMOS according to Embodiment 6 of the present invention with the gate being on. FIG. 13 is a plan view with the gate electrode and the gate insulation film removed from FIG. 12. Members and parts similar to those in Embodiment 5 are designated by similar reference marks, but with the suffix "6" instead of "5."

Embodiment 6 is similar to Embodiment 5, and its difference from Embodiment 5 is similar to the difference of Embodiment 3 from Embodiment 2. That is, the shapes of the drain, source, rounding regions, and gate electrode are different. Specifically, the drain D6 and the source S6 of this embodiment are divided and are separated from the device isolation region E6 in the lateral direction of the gate electrode G6, only at the parts D6a and S6a proximate to each other. At parts D6b and S6b far from each other, the drain D6 and the source S6 are not divided, and of the same width as the width A6 of the active region K6, and are in contact with the vertically-extending edges K6b of the device isolation region E6. Thus, each of the drain D6 and the source S6 comprises divided parts (D6a, D6b) proximate to each other and an undivided part (D6b, S6b) far from each other. Rounding regions M6 are formed between the divided parts D6a and S6a proximate to each other, between the divided parts D6a and S6a and the device isolation region E6, between the divisions of the channel CH6, and between the (outermost) divisions of the channel and the device isolation region E6. In other words, the rounding regions M6 are formed to occupy only parts MC6 on extensions, in the lateral direction of the gate electrode G6, of the channel CH6 positioned between the source S6 and the drain D6, with the extensions including parts extending laterally outwards, and a part extending between the channels CH6, and parts MD6 and MS6 adjacent to the parts MC6 in the longitudinal direction of the gate electrode G6. The gate electrode G6 is formed to cover not only the channel CH6 but also the entire rounding regions M6.

With the configuration described above, if the sum of widths, B6, of the divided parts D6a and S6a proximate to each other are identical to the width B5 of the drain D5 and source S5 of Embodiment 5, the on-current will be about the same as Embodiment 5. This is because the current components which flow out and enter the parts of the drain D5 and source S5 which are far away from each other are very small and are negligible.

On the other hand, Embodiment 6 has an advantage in that undivided parts D6b and S6b of the drain D6 and the source S6 far away from each other have a greater width compared with Embodiment 1 and Embodiment 5, and the size of the gate electrode G6 is smaller than in Embodiment 5, so that the areas which can be used for contact with the drain D6 and source S6 is larger, and formation of contacts is easier.

Embodiment 7

Figure 14:
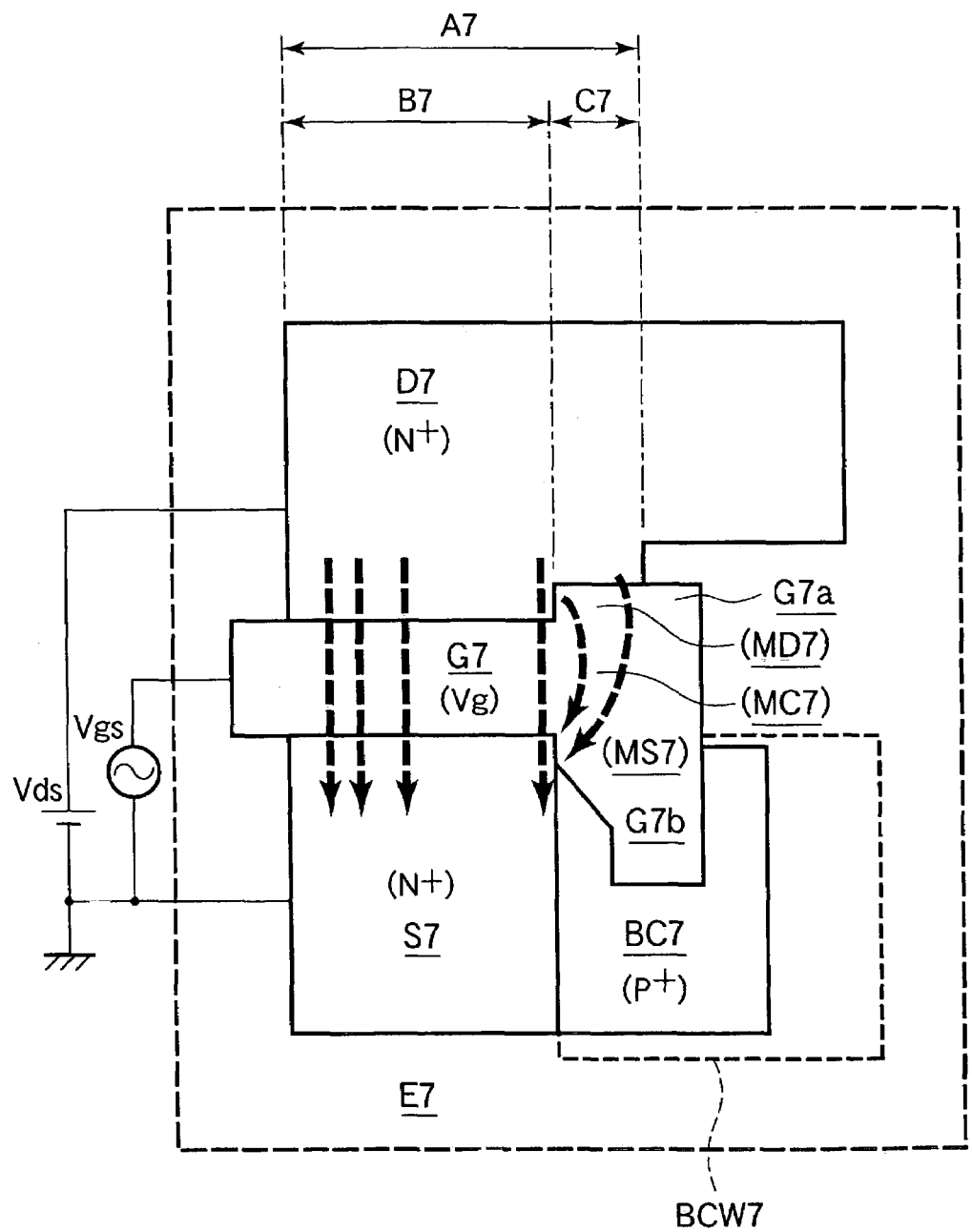
Figure 15:
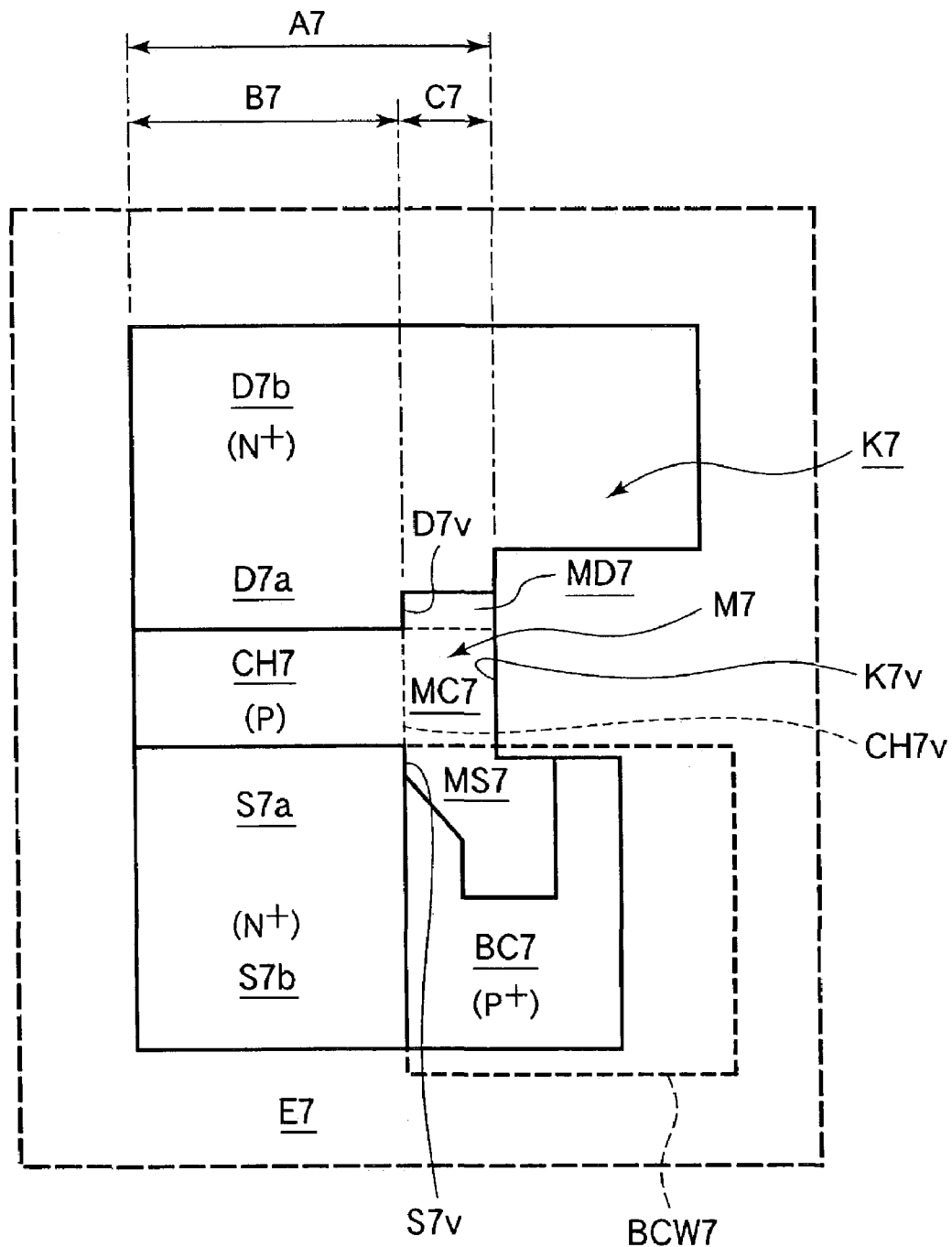
FIG. 15 is a plan view with the gate electrode and the gate insulating film removed from FIG. 14.

FIG. 14 is a schematic plan view showing the operation of the NMOS according to Embodiment 7 of the present invention with the gate being on. FIG. 15 is a plan view with the gate electrode and the gate insulation film removed from FIG. 14. Members and parts similar to those in Embodiment 1 are designated by similar reference marks, but with the suffix "7" instead of "1." The NMOS of this embodiment is of an SOI structure suitable for formation of an SRAM.

This embodiment is similar to Embodiment 1, but differs from it in the following respects. That is, the drain D7 and the source S7 have parts separated by a distance C7 from the device isolation region E7 in the lateral direction of the gate electrode G7, only on one side, e.g., on the right side in the drawing. On the other side, the left side in the drawing, the drain D7 and the source S7 are in contact with the device isolation region E7.

More specifically, the active region K7 has a varying width, which differs depending on the position in the longitudinal direction of the gate electrode G7. First, the width of the active region K7 is different between the part in which the drain is provided and the part in which the source is provided. The drain D7 has one of its edges, the left edge in the drawing, in contact with an edge of the device isolation region E7, has the width at the part D7a proximate to the source S7, narrower than the width of the corresponding part of the active region K7 (the part of the active region K7 at the same position in the longitudinal direction of the gate electrode), and has its other edge, the right edge in the drawing, separated from the device isolation region E7 at the same position, and a drain-side rounding region MD7 is formed between the drain D7 and the device isolation region E7. The width of the drain D7 is increased step-wise, with increase in the distance from the source S7, and at the positions far from the source S7, the right edge of the drain D7 coincides with the edge of the device isolation region E7 at that position.

The source S7 on the other hand is rectangular, and has a width, at any position, narrower than the width of the active region K7 at the same position. The left edge in the drawing is coincident with the edge of the device isolation region E7, while the right edge in the drawing is separated from the device isolation region E7 at the same position, and a source-side rounding region MS7 and a body contact region BC7 are formed between the right edge of the source S7 and the device isolation region E7.

The body contact region BC7 is doped so that it is of a P+ type. Doping of the body contact region BC7 is performed by ion implantation using a mask having an opening indicated by BCW7. The body contact region BC7 also forms part of an active region K7 in this embodiment.

The channel CH7 is narrower than the width of the active region at the same position, and a rounding channel region MC7 is formed between the right edge of the channel CH7 and the device isolation region E7, while the left edge of the channel CH7 is in contact with device isolation region E7.

The drain-side rounding region MD7, the source-side rounding region MS7, and the rounding channel region MC7 in combination form a rounding region M7.

Even in this configuration, the rounding region M7 increases the on-current, and improves the on-current to off-current ratio.

It will be observed from the description of the present embodiment, that the shapes and positions of the drain, source, and rounding region can be altered in various ways depending on the position of the contact or the like.

The various embodiments described above relate to an N-channel MOSFET, but the invention is applicable to P-type MOSFET, and any other type of planar MISFETs.

What is claimed is:

1. A field effect transistor having
   an active region in which a source and a drain are formed and which is defined by a device isolation region, and
   a gate electrode disposed above the active region, the gate electrode having gate length and gate width,
   wherein at least parts of the source and the drain proximate to each other have widths along a direction parallel to a gate width direction of the gate electrode which are narrower than widths of corresponding parts of the active region in the gate width direction.

2. The field effect transistor according to claim 1, wherein widths of parts of the source and the drain other than said parts proximate to each other are substantially equal to the width of the active region.

3. The field effect transistor according to claim 1, wherein the parts of the source and the drain which are proximate to each other are divided along the gate width direction of the gate electrode, and a sum of dimensions of the divided source and a sum of dimensions of the divided drain in the gate width direction are respectively smaller than the width of the active region.

4. The field effect transistor according to claim 3, wherein parts of the source and the drain other than the parts proximate to each other are not divided along the gate width direction of the gate electrode.

5. The field effect transistor according to claim 3, wherein parts of the active region which are between the divided source and parts of the active region between the divided drain contain the same impurity at the same concentration as part of the active region between the source and the drain.

6. The field effect transistor according to claim 1, wherein the gate electrode is formed to cover a part of the active region which is adjacent to a part of the active region on an extension of a part of the active region between the source and the drain.

7. The field effect transistor according to claim 6, wherein the gate electrode is formed to cover substantially all of the parts of the active region in addition to the part between the source and the drain.

8. A field effect transistor having
   an active region in which a source and a drain are formed and which is defined by and within a device isolation region, and
   a gate electrode disposed above the active region, the gate electrode having gate length and gate width,
   wherein at least a part of the source on a first side of the gate electrode is separated from said device isolation region on the first side of the gate electrode, in a direction parallel to a gate width direction of the gate electrode, by a part of the active region, and
   wherein at least part of the drain on a second side of the gate electrode is separated from said device isolation region on the second side of the gate electrode, in the direction parallel to the gate width direction of the gate electrode, by another part of the active region.

9. The field effect transistor according to claim 8, wherein said at least a part of the source that is separated from said device isolation region on the first side of the gate electrode by the part of the active region, is a part of the source proximate to the drain, and
   wherein said at least a part of the drain on the second side of the gate electrode that is separated from said device isolation region on the second side of the gate electrode by the another part of the active region, is a part of the drain proximate to the source.

10. The field effect transistor according to claim 9, wherein parts of the source and the drain other than said at least a part of the source and said at a least part of the drain proximate to each other, are in contact with the device isolation region.

11. The field effect transistor according to claim 9, wherein parts of the active region which are between the source and the device isolation region, and which are between the drain and the device isolation region, contain a same impurity at a same concentration as a part of the active region which is between the source and the drain.

12. The field effect transistor according to claim 8, wherein the gate electrode is formed to cover a part of the active region which is adjacent to a part of the active region on an extension of a part of the active region between the source and the drain.

13. The field effect transistor according to claim 12, wherein the gate electrode is formed to cover substantially all of the parts of the active region in addition to the part between the source and the drain.

14. A field effect transistor comprising:
   an active region of first conductivity type surrounded by a device isolation region;
   a gate electrode extending entirely across the active region, the gate electrode having gate width and gate length;
   a source region of a second conductivity type formed in the active region adjacent a first side of the gate electrode, the second conductivity type being opposite the first conductivity type; and
   a drain region of the second conductivity type formed in the active region adjacent a second side of the gate electrode opposite the first side of the gate electrode,
   the active region including a rounding region of the first conductivity type separating the source region and the drain region from the device isolation region in a direction parallel to a gate width direction of the gate electrode.

* * * * *